United States Patent
Rofougaran et al.

(10) Patent No.: US 8,005,444 B2
(45) Date of Patent: Aug. 23, 2011

(54) MULTIPLE DIE INTEGRATED CIRCUIT ASSEMBLY

(75) Inventors: Ahmadreza Reza Rofougaran, Newport Coast, CA (US); Maryam Rofougaran, Rancho Palos Verdes, CA (US); Vafa James Rakshani, Newport Coast, CA (US); Hooman Darabi, Irvine, CA (US); Claude G. Hayek, Huntington Beach, CA (US); Frederic Christian Marc Hayem, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 955 days.

(21) Appl. No.: 11/888,783

(22) Filed: Aug. 2, 2007

(65) Prior Publication Data

US 2009/0036070 A1 Feb. 5, 2009

(51) Int. Cl.
*H04B 1/04* (2006.01)
(52) U.S. Cl. ............... 455/126; 455/127.4; 455/118; 455/553.1; 455/69; 455/260; 455/66.1; 375/146; 375/267; 370/343; 370/347
(58) Field of Classification Search ............ 455/126, 455/127.4, 553.1, 69, 66.1, 74, 550.1, 260, 455/333, 118; 375/146, 267; 370/343, 347
See application file for complete search history.

(56) References Cited

U.S. PATENT DOCUMENTS

| | | | | |
|---|---|---|---|---|
| 6,208,844 | B1 * | 3/2001 | Abdelgany | 455/82 |
| 6,678,778 | B2 * | 1/2004 | Kikinis | 710/305 |
| 6,713,375 | B2 * | 3/2004 | Shenoy | 438/612 |
| 6,952,573 | B2 * | 10/2005 | Schucker et al. | 455/333 |
| 7,433,397 | B2 * | 10/2008 | Garlepp et al. | 375/229 |
| 7,477,915 | B2 * | 1/2009 | Leinonen et al. | 455/550.1 |
| 7,592,954 | B2 * | 9/2009 | Rofougaran | 342/357.32 |
| 7,596,356 | B2 * | 9/2009 | Rofougaran et al. | 455/73 |
| 7,617,342 | B2 * | 11/2009 | Rofougaran | 710/100 |
| 7,673,072 | B2 * | 3/2010 | Boucher et al. | 709/245 |
| 7,697,159 | B2 * | 4/2010 | Henderson et al. | 358/1.18 |
| 7,715,836 | B2 * | 5/2010 | Vassiliou et al. | 455/423 |
| 7,729,722 | B2 * | 6/2010 | Rofougaran et al. | 455/550.1 |
| 7,764,932 | B2 * | 7/2010 | Rofougaran et al. | 455/77 |
| 2006/0223455 | A1 * | 10/2006 | Kerth | 455/76 |
| 2006/0262882 | A1 * | 11/2006 | Gronemeyer et al. | 375/316 |

* cited by examiner

*Primary Examiner* — Marceau Milord
(74) *Attorney, Agent, or Firm* — Garlick Harrison & Markison; Kevin L. Smith

(57) ABSTRACT

An integrated circuit (IC) includes a first die, a second die, a packaging substrate, and coupling circuit. The first die includes first circuitry and the second die includes second circuitry. The packaging substrate supports the first and second dies, wherein the first and second dies are stacked with respect to the packaging substrate. The coupling circuit couples the first die to the second die, wherein the first and second circuitry communicate via the coupling circuit.

19 Claims, 10 Drawing Sheets

MULTIPLE DIE INTEGRATED CIRCUIT ASSEMBLY

CROSS REFERENCE TO RELATED PATENTS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to integrated circuits and more particularly to integrated circuits used within wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

As is generally known, transceivers, such as the ones described above, are in the physical (PHY) layer of the communication stack. The other layers include medium access control (MAC) layer, network layer, transport layer, session layer, presentation layer, and application layer. For a host communication device to support a wireless communication, it includes firmware to process each of these layers and also includes firmware to process an operating system and user applications (e.g., digital camera, email, web browsing, voice recorder).

In recent technological advancements, multiple dies may be included within an integrated circuit package, wherein the dies are mounted on a package substrate. While this provides a single IC from a device standpoint, it does require about the same amount of printed circuit board (PCB) area as if the dies were in separate IC packages.

Therefore, a need exists for an integrated circuit (IC) that includes multiple dies with a foot print approximating the foot print of a single die IC package.

BRIEF SUMMARY OF THE INVENTION

The present invention is directed to apparatus and methods of operation that are further described in the following Brief Description of the Several Views of the Drawing(s), the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

DETAILED DESCRIPTION OF THE INVENTION

Figure 1:
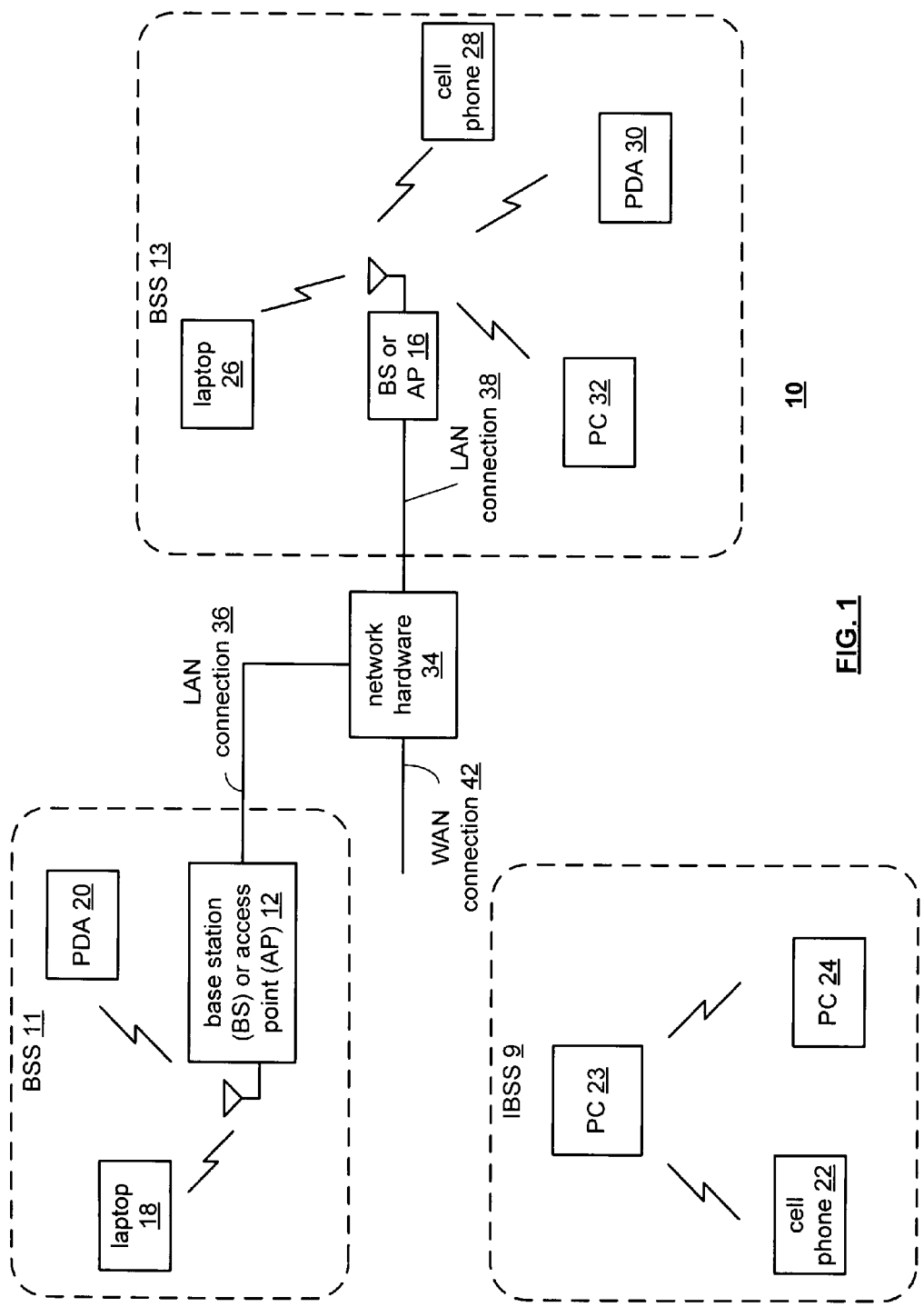
FIG. 1 is a schematic block diagram of an embodiment of a wireless communication system in accordance with the present invention.

FIG. 1 is a schematic block diagram illustrating a communication system 10 that includes a plurality of base stations and/or access points 12, 16, a plurality of wireless communication devices 18-32 and a network hardware component 34. Note that the network hardware 34, which may be a router, switch, bridge, modem, system controller, et cetera provides a wide area network connection 42 for the communication system 10. Further note that the wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to one or more of FIGS. 2-14.

Wireless communication devices 22, 23, and 24 are located within an independent basic service set (IBSS) area and communicate directly (i.e., point to point). In this configuration, these devices 22, 23, and 24 may only communicate with each other. To communicate with other wireless communication devices within the system 10 or to communicate outside of the system 10, the devices 22, 23, and/or 24 need to affiliate with one of the base stations or access points 12 or 16.

The base stations or access points 12, 16 are located within basic service set (BSS) areas 11 and 13, respectively, and are operably coupled to the network hardware 34 via local area network connections 36, 38. Such a connection provides the base station or access point 12 16 with connectivity to other devices within the system 10 and provides connectivity to other networks via the WAN connection 42. To communicate with the wireless communication devices within its BSS 11 or 13, each of the base stations or access points 12-16 has an associated antenna or antenna array. For instance, base station or access point 12 wirelessly communicates with wireless communication devices 18 and 20 while base station or access point 16 wirelessly communicates with wireless communication devices 26-32. Typically, the wireless communication devices register with a particular base station or access point 12, 16 to receive services from the communication system 10.

Generally, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
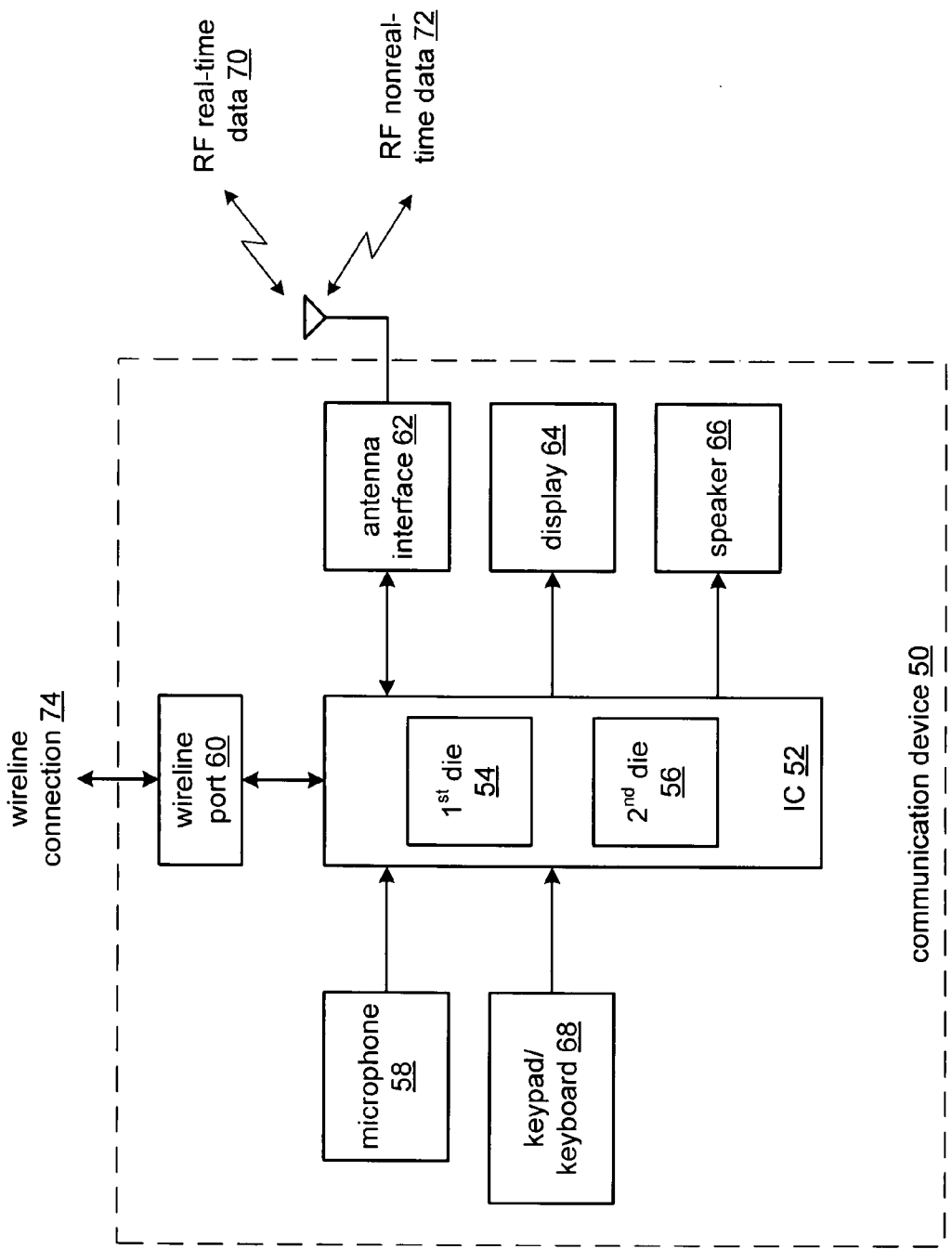
FIG. 2 is a schematic block diagram of an embodiment of a wireless communication device in accordance with the present invention.

FIG. 2 is a schematic block diagram of an embodiment of a wireless communication device 50 that includes an IC (integrated circuit) 52, an antenna interface 62, a display 64, a keypad and/or key board 68, at least one microphone 58, at least one speaker 66, and a wireline port 60. The IC 52 includes a first die 554 and a second die 56. The second die 56 may include memory, which may be NAND flash, NOR flash, SDRAM, and/or SRAM for storing data and/or instructions to facilitate communications of real-time and non-real-time data via the wireline port 60 and/or via the antenna interface 62. In addition, or in the alternative, the memory may store video files, audio files, and/or image files for subsequent wireline or wireless transmission, for subsequent display, for file transfer, and/or for subsequent editing. Accordingly, when the communication device 50 supports storing, displaying, transferring, and/or editing of audio, video, and/or image files, the memory would further store users algorithms to support such storing, displaying, and/or editing. For example, the algorithms may include, but is not limited to, file transfer algorithm, video compression algorithm, video decompression algorithm, audio compression algorithm, audio decompression algorithm, image compression algorithm, and/or image decompression algorithm, such as MPEG (motion picture expert group) encoding, MPEG decoding, JPEG (joint picture expert group) encoding, JPEG decoding, MP3 encoding, and MP3 decoding.

For outgoing voice communications, the at least one microphone 58 receives an audible voice signal, amplifies it, and provides the amplified voice signal to the IC 52. The IC 52 processes the amplified voice signal into a digitized voice signal using one or more audio processing schemes (e.g., pulse code modulation, audio compression, etc.). The IC 52 may transmit the digitized voice signal via the wireless port 60 to a wireline real-time device and/or to the wireline non-real-time device (e.g., a personal computer, laptop computer, personal digital assistant, a cellular telephone, a cable set-top box, a satellite set-top box, a game console, a wireless local area network (WLAN) transceiver, a Bluetooth transceiver, a frequency modulation (FM) tuner, a broadcast television tuner, a digital camcorder, and/or any other device that has a wireline and/or wireless interface for conveying real-time data with another device). In addition to, or in the alternative, the IC 52 may transmit the digitized voice signal as RF real-time data to a wireless real-time device (e.g., a base station, an access point, another communication device, etc.), and/or to a wireless non-real-time device via the antenna interface 62s.

For outgoing real-time audio and/or video communications, the IC 52 retrieves an audio and/or video file from the memory. The IC 52 may decompress the retrieved audio and/or video file into digitized streaming audio and/or video. The IC 52 may transmit the digitized streaming audio and/or video via the wireless port 60 to the wireline real-time device and/or to the wireline non-real-time device. In addition to, or in the alternative, the IC 52 may transmit the digitized streaming audio and/or video as RF real-time data 106 to the wireless real-time device, and/or to the wireless non-real-time device via the antenna interface 62. Note that the IC 52 may mix a digitized voice signal with a digitized streaming audio and/or video to produce a mixed digitized signal that may be transmitted via the wireline port 60 and/or via the antenna interface 62.

In a playback mode of the communication device 50, the IC 52 retrieves an audio and/or video file from the memory. The IC 52 may decompress the retrieved audio and/or video file into digitized streaming audio and/or video. The IC 52 may convert an audio portion of the digitized streaming audio and/or video into analog audio signals that are provided to the at least one speaker 66. In addition, the IC 52 may convert a video portion of the digitized streaming audio and/or video into analog or digital video signals that are provided to the display 64, which may be a liquid crystal (LCD) display, a plasma display, a digital light project (DLP) display, and/or any other type of portable video display.

For incoming RF voice communications, the antenna interface 62 receives, via an antenna, inbound RF real-time data 70 (e.g., inbound RF voice signals) and provides them to the IC 52. The IC 52 processes the inbound RF voice signals into digitized voice signals. The IC 52 may transmit the digitized voice signals via the wireless port 60 to the wireline real-time device and/or to the wireline non-real-time device. In addition to, or in the alternative, the IC 52 may convert the digitized voice signals into an analog voice signals and provide the analog voice signals to the speaker 66.

The IC 52 may receive digitized voice-audio and/or -video signals from the wireline connection 74 via the wireless port 0 or may receive RF signals via the antenna interface 60, where the IC 52 recovers the digitized voice-audio-&/or-video signals from the RF signals. The IC 52 may then compress the received digitized voice-audio and/or -video signals to produce voice-audio and/or -video files and store the files in memory. In the alternative, or in addition to, the IC 52 may convert the digitized voice-audio and/or -video signals into analog voice-audio and/or -video signals and provide them to the speaker 66 and/or to the display 64.

For outgoing non-real-time data communications, the keypad/keyboard 68 (which may be a keypad, keyboard, touch screen, voice activated data input, and/or any other mechanism for inputted data) provides inputted data (e.g., emails, text messages, web browsing commands, etc.) to the IC 52. The IC 52 converts the inputted data into a data symbol stream using one or more data modulation schemes (e.g., QPSK, 8-PSK, etc.). The IC 52 converts the data symbol stream into RF non-real-time data signals 72 that are provided to the antenna interface 62 for subsequent transmission via the antenna. In addition to, or in the alternative, the IC 52 may provide the inputted data to the display 64. As another alternative, the IC 52 may provide the inputted data to the wireline port 60 for transmission to the wireline non-real-time data device and/or the non-real-time device.

For incoming non-real-time communications (e.g., text messaging, image transfer, emails, web browsing), the antenna interface 62 receives, via an antenna, inbound RF non-real-time data signals 72 (e.g., inbound RF data signals) and provides them to the IC 52. The IC 52 processes the inbound RF data signals into data signals. The IC 52 may transmit the data signals via the wireless port 60 to the wireline non-real-time device and/or to the wireline non-real-time device. In addition to, or in the alternative, the IC 52 may convert the data signals into analog data signals and provide the analog data signals to an analog input of the display 64 or the IC 52 may provide the data signals to a digital input of the display 64.

Figure 3:
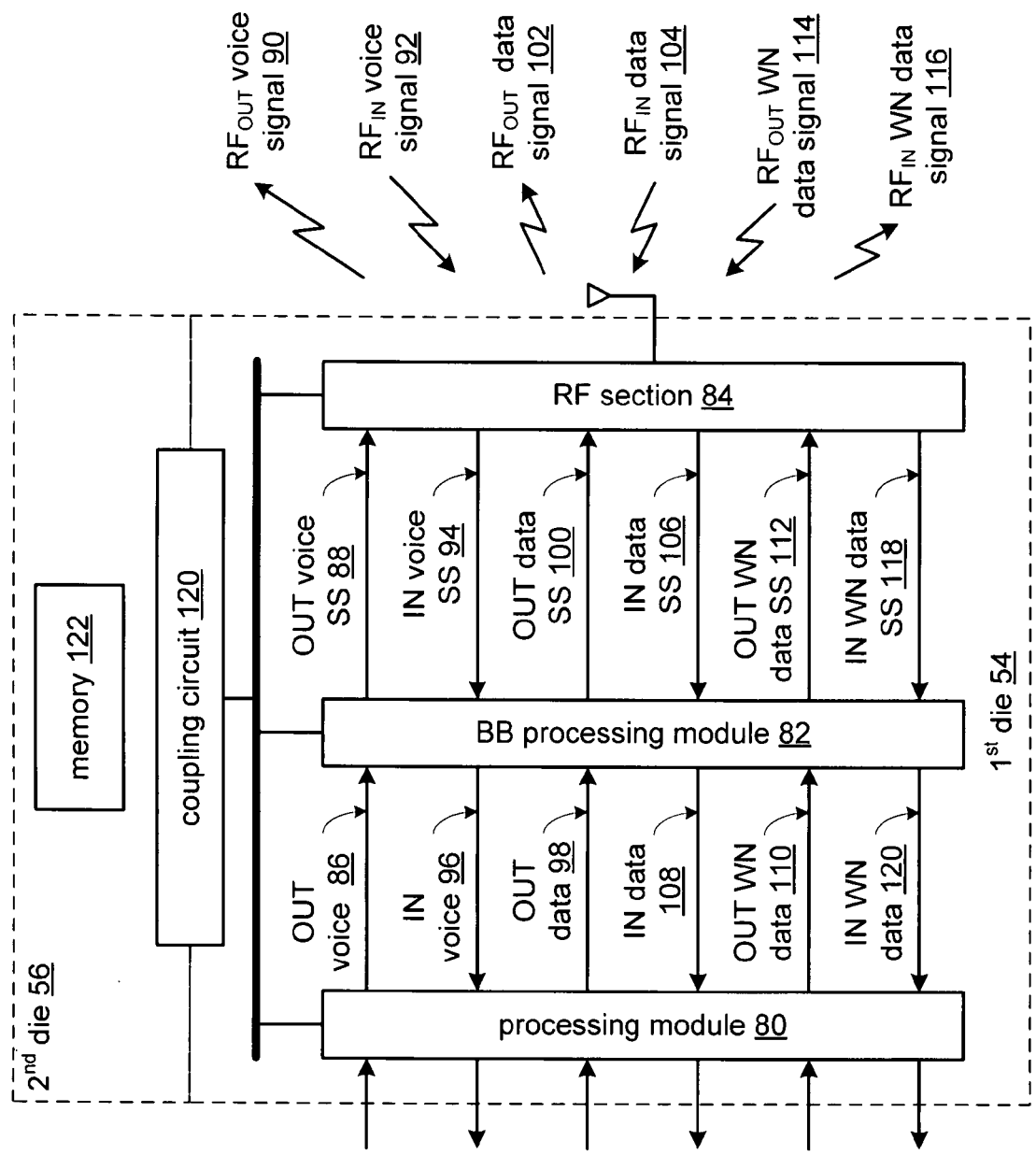
FIG. 3 is a schematic block diagram of an embodiment of an integrated circuit (IC) in accordance with the present invention.

FIG. 3 is a schematic block diagram of an embodiment of an integrated circuit (IC) 52 that includes the first die 54, the second die 56, and a coupling circuit 120. The second die 56 includes memory 122. The first die 54 includes a processing module 80, a baseband (BB) processing module 82, and a radio frequency (RF) section 84. The processing module 80 and the BB processing module 82 may be separate processing modules and/or shared processing modules, where a processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module(s) may have an associated memory and/or memory element, which may be a single memory device, a plurality of memory devices, and/or embedded circuitry of the processing module(s). Such a memory device may be a read-only memory, random access memory, volatile memory, non-volatile memory, static memory, dynamic memory, flash memory, cache memory, and/or any device that stores digital information. Note that when the processing module(s) implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module(s) executes, hard coded and/or operational instructions corresponding to at least some of the steps and/or functions illustrated in FIGS. 3-14.

In an embodiment, the baseband processing module 82 is coupled to convert an outbound voice physical layer signal 86 into an outbound voice symbol stream 88 and to convert an inbound voice symbol stream 84 into an inbound voice physical layer signal 96 in accordance with a cellular voice protocol (e.g., past, present, or future versions of GSM, AMPS, CDMA, WCDMA, etc.). The processing module 80 processes inbound and outbound voice physical layer signals 86 and 96 in accordance with the upper layers (e.g., medium access control (MAC) layer, network layer, transport layer, session layer, presentation layer, and application layer) of the wireless communication protocol to provide inbound and outbound voice signals.

In another embodiment, the baseband processing module 82 converts outbound physical layer data 98 into an outbound data symbol stream 100 and converts an inbound data symbol stream 106 into inbound physical layer data 108 in accordance with a cellular data protocol (e.g., past, present, or future versions of EDGE, GPRS, HSDPA, HSUPA, etc.). The processing module 80 processes inbound and outbound physical layer data 98 and 108 in accordance with the upper layers (e.g., medium access control (MAC) layer, network layer, transport layer, session layer, presentation layer, and application layer) of the wireless communication protocol to provide inbound and outbound data signals.

In another embodiment, the baseband processing module 82 converts outbound wireless network physical layer data 110 into an outbound wireless network (WN) data symbol stream 112 and converts an inbound wireless network data symbol stream 118 into inbound wireless network physical layer data 120 in accordance with a wireless network protocol (e.g., past, present, or future versions of Bluetooth, IEEE 802.11, ZIGBEE, RFID, a near field communication protocol, and/or a far field communication protocol, etc.). The processing module 80 processes inbound and outbound physical layer WN data 110 and 120 in accordance with the upper layers (e.g., medium access control (MAC) layer, network layer, transport layer, session layer, presentation layer, and application layer) of the wireless communication protocol to provide inbound and outbound WN data signals.

The RF section 84 converts an inbound RF voice signal 90 into the inbound voice symbol stream 88 and converts the outbound voice symbol stream 94 into an outbound RF voice signal 92 in accordance with the cellular voice protocol. The RF section 84 may also convert an inbound RF data signal 104 into the inbound data symbol stream 106 and convert the outbound data symbol stream 100 into an outbound RF data signal 102 in accordance with the cellular data protocol. The RF section 84 may further convert an inbound RF wireless network data signal 116 into the inbound wireless network data symbol stream 118 and convert the outbound wireless network data symbol stream 112 into an outbound RF wireless network data signal 114 in accordance with the wireless network protocol.

In various uses of the IC 52, the processing module 80, the baseband processing module 82, and the RF section 84 may perform one or more of: converting the inbound RF voice signal into an outbound wireless personal area network (WPAN) RF voice signal; converting the inbound RF voice signal into an outbound wireless local area network (WLAN) RF voice signal; converting the inbound RF voice signal into an inbound analog voice signal; converting the inbound RF data signal into an outbound WPAN RF data signal; converting the inbound RF data signal into an outbound WLAN RF data signal; converting the inbound RF data signal into an inbound data display signal; converting an outbound RF WPAN signal into an outbound RF voice signal; and converting an outbound RF WPAN signal into an outbound RF WLAN signal.

Figure 4:
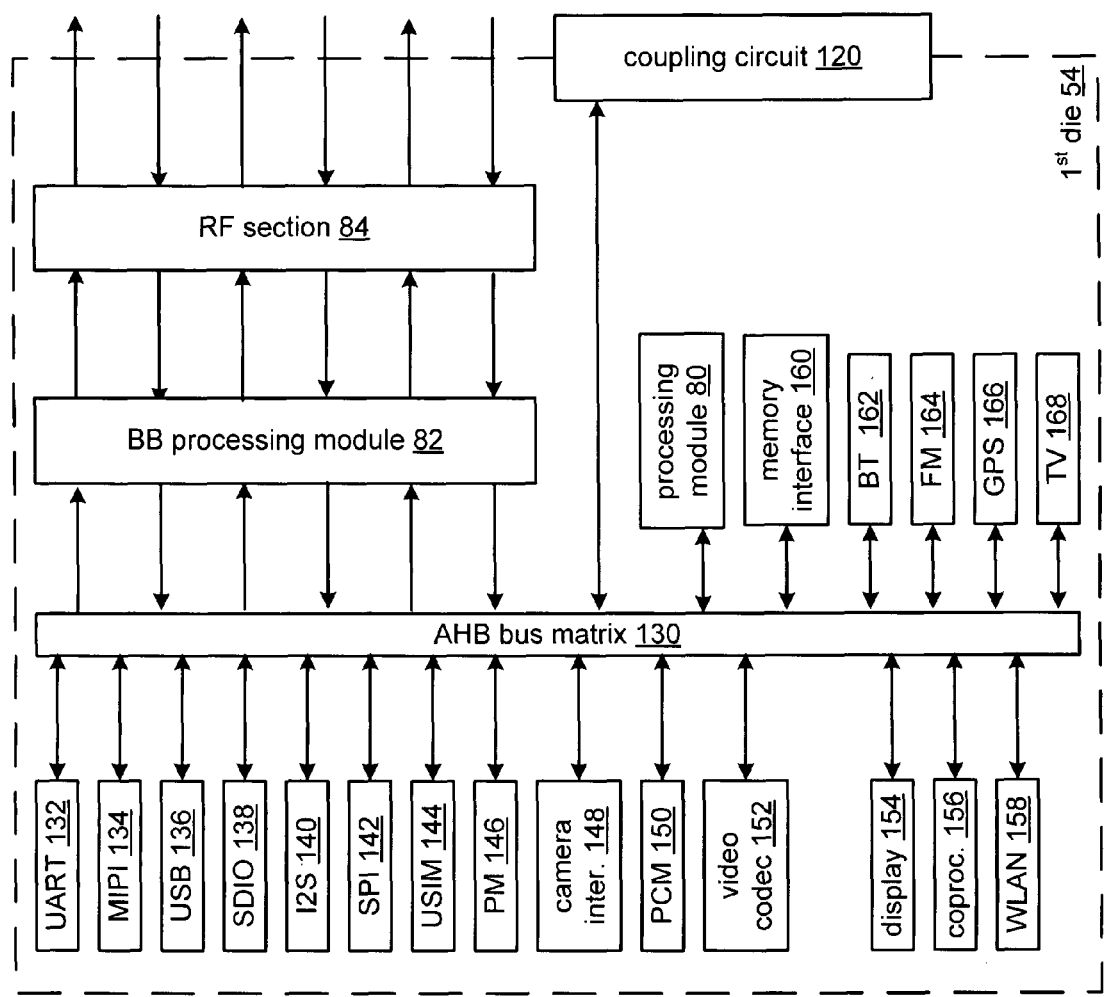
FIG. 4 is a schematic block diagram of another embodiment of an integrated circuit (IC) in accordance with the present invention.

FIG. 4 is a schematic block diagram of another embodiment of an integrated circuit (IC) 52 where the first die 54 includes the processing module 80, the baseband processing module 82, the data RF section 84, an AHB bus matrix 130, an optional memory interface 160, and one or more of a plurality of peripheral interface modules. The plurality of peripheral interface modules includes a mobile industry processor interface (MIPI) interface 134, a universal serial bus (USB) interface 136, a secure digital input/output (SDIO) interface 138, an I2S interface 140, a Universal Asynchronous Receiver-Transmitter (UART) interface 132, a Serial Peripheral Interface (SPI) interface 142, a power management (PM) interface 146, a universal subscriber identity module (USIM) interface 144, a camera interface 148, a pulse code modulation (PCM) interface 150, a video codec 152, a second display interface 154, a coprocessor interface 156, a WLAN interface 158, a Bluetooth interface 162, an FM interface 164, a GPS interface 166, and a TV interface 168.

In an embodiment, the coupling circuit 120 is coupled to the AHB bus matrix 130 such that any of the modules and/or interfaces coupled to the bus may communicate with circuitry of the second die 56 via the coupling circuit 120. In another embodiment, the coupling circuit 120 is coupled to the memory interface 160 such that memory on the second die 56 may be accessed by one or more of the modules and/or interfaces of the first die 54.

Figure 5:
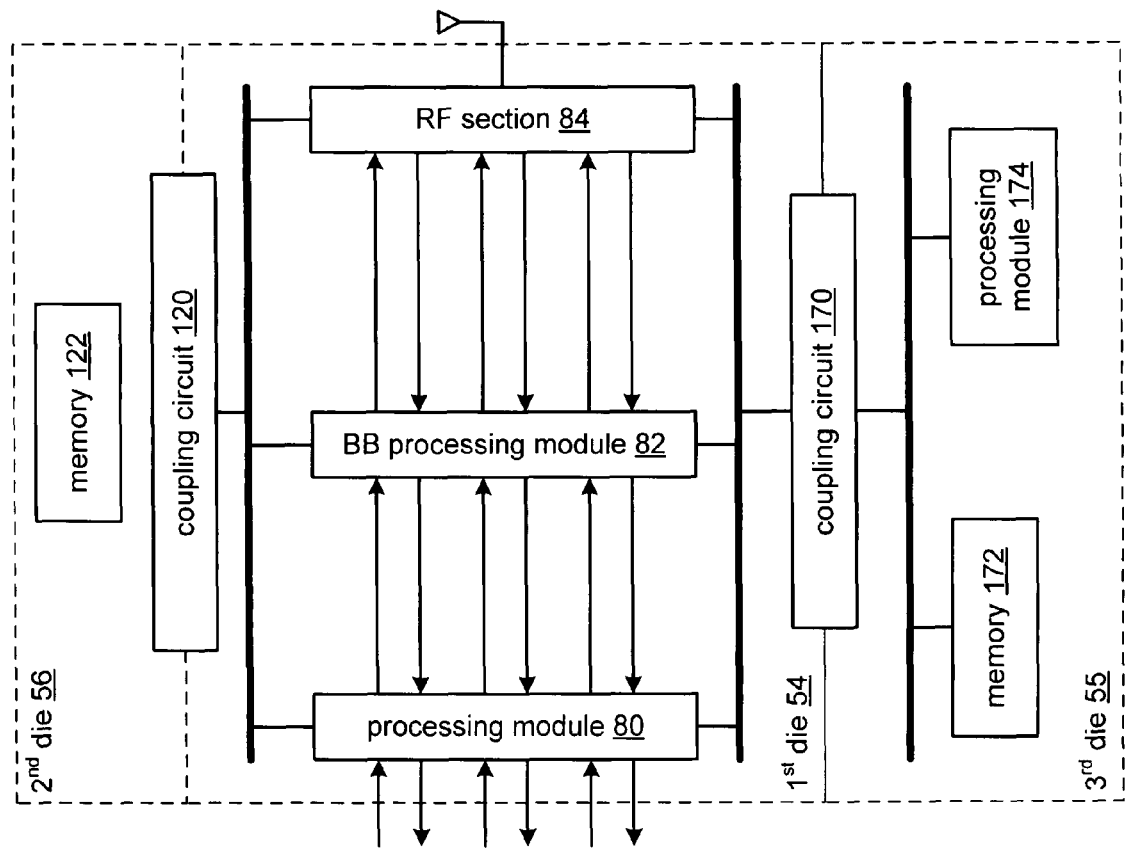
FIG. 5 is a schematic block diagram of another embodiment of an integrated circuit (IC) in accordance with the present invention.

FIG. 5 is a schematic block diagram of another embodiment of an integrated circuit (IC) 52 that includes the first die 54, the second die 56, and a third die 55. The first die 54 includes the processing module 80, the BB processing module 82, and the RF section 84. The second die 56 includes memory 122 (e.g., read-only memory, random access memory, volatile memory, non-volatile memory, static memory, dynamic memory, flash memory, cache memory, and/or any device that stores digital information). The third die 55 includes a processing module 174 and memory 172. The processing module 172 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory 172 and/or memory element 172, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions illustrated in FIGS. 5-14.

A first coupling circuit 120 couples the first die 54 to the second die 56. A second coupling circuit 170 couples the first die to the third die 55. Various embodiments of the coupling circuit 120 and 170 will be described in greater detail with reference to FIGS. 10-14.

Figure 6:
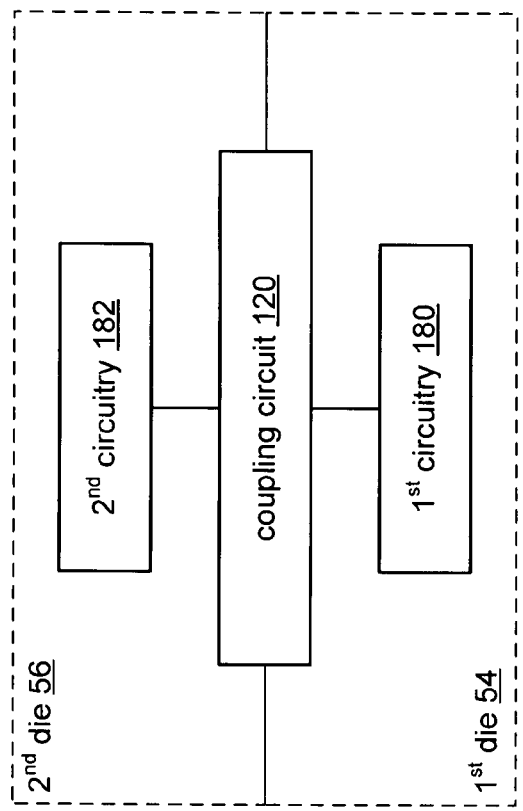
FIG. 6 is a schematic block diagram of another embodiment of an integrated circuit (IC) in accordance with the present invention.

FIG. 6 is a schematic block diagram of another embodiment of an integrated circuit (IC) 52 that includes the first die 54, the second die 56, and the coupling circuit 120. The first die 54 includes first circuitry 180 and the second die 56 includes second circuitry 182. The first and second circuitry 180 and 182 may each be an analog circuit, a digital circuit, a processing module, memory, logic circuit, programmable logic, and/or a combination thereof.

Figure 7:
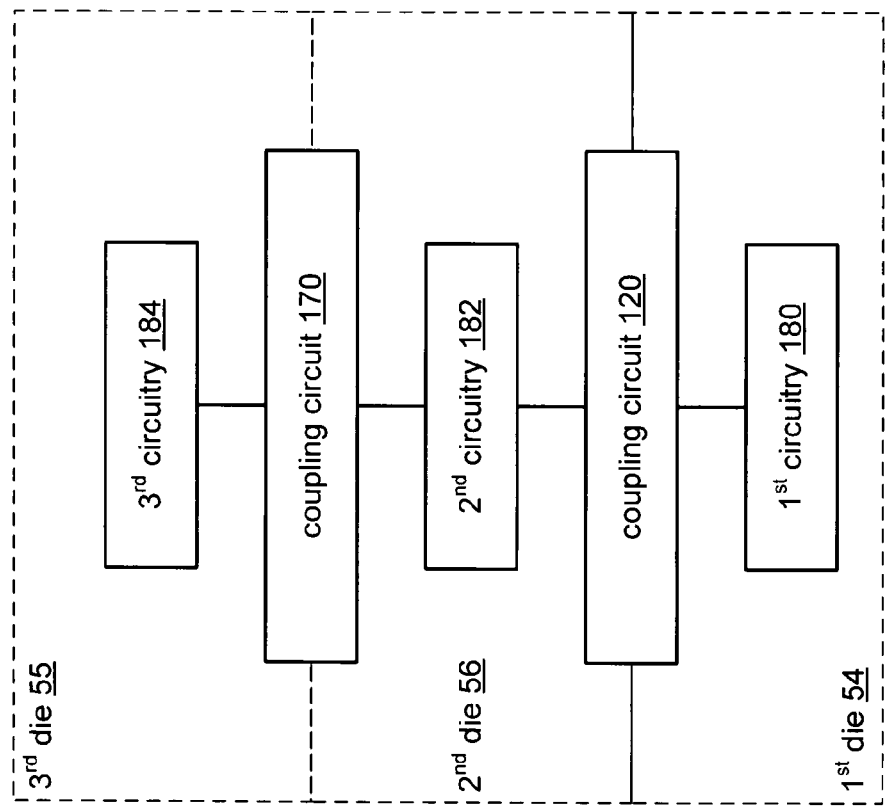
FIG. 7 is a schematic block diagram of another embodiment of an integrated circuit (IC) in accordance with the present invention.

FIG. 7 is a schematic block diagram of another embodiment of an integrated circuit (IC) 52 that includes the first die 54, the second die 56, the third die, the first coupling circuit 120, and the second coupling circuit 170. The first die 54 includes first circuitry 180, the second die 56 includes second circuitry 182, and the third die 55 includes third circuitry 184. The first, second and third circuitry 180-184 may each be an analog circuit, a digital circuit, a processing module, memory, logic circuit, programmable logic, and/or a combination thereof.

Figure 8:
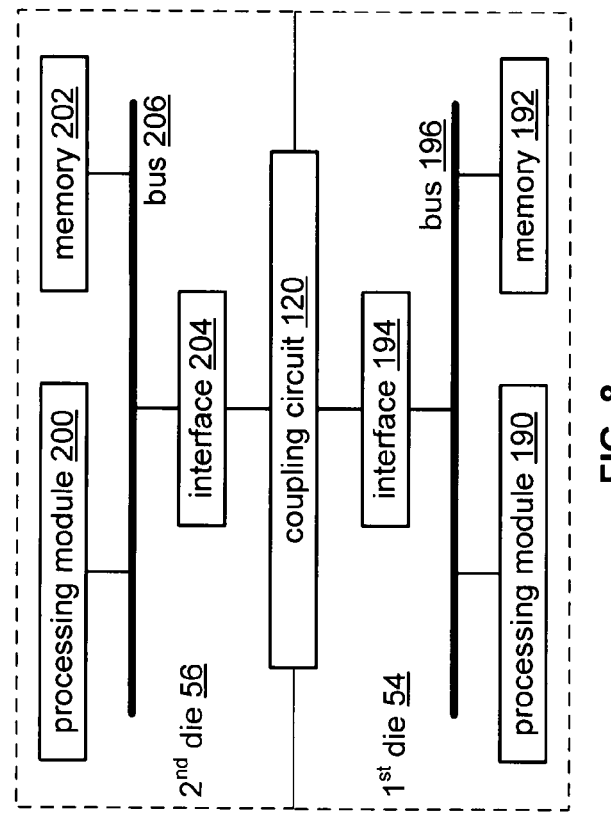
FIG. 8 is a schematic block diagram of another embodiment of an integrated circuit (IC) in accordance with the present invention.

FIG. 8 is a schematic block diagram of another embodiment of an integrated circuit (IC) 52 that includes the first die 54, the second die 56, and the coupling circuit 120. The first die 54 includes a processing module 190, memory 192, a bus 196, and an interface 194, which is coupled to the coupling circuit 120. The second die 56 includes a processing module 200, memory 202, a bus 206, and an interface 204, which is coupled to the coupling circuit 120. In this embodiment, the processing modules 190 and 200 may be used as parallel processors, independent processors, and/or as co-processors. In addition, or in the alternative, the memory 192 and 202 may be used as a single memory device, as shared memory devices, and/or as independent memories.

Figure 9:
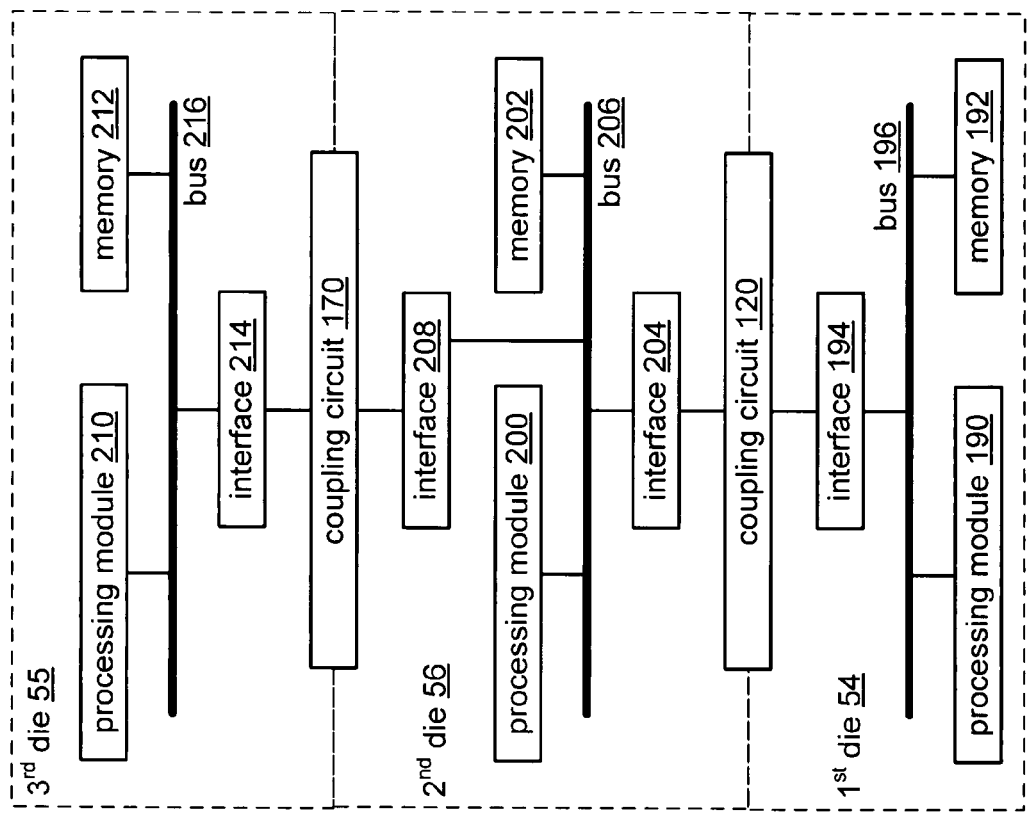
FIG. 9 is a schematic block diagram of another embodiment of an integrated circuit (IC) in accordance with the present invention.

FIG. 9 is a schematic block diagram of another embodiment of an integrated circuit (IC) that includes the first die 54, the second die 56, the third die 55, the first coupling circuit 120, and the second coupling circuit 170. The first die 54 includes a processing module 190, memory 192, a bus 196, and an interface 194, which is coupled to the coupling circuit 120 and to coupling circuit 170. The second die 56 includes a processing module 200, memory 202, a bus 206, and an interface 204, which is coupled to the coupling circuit 120. The third die 55 includes a processing module 210, memory 212, a bus 216, and an interface 214, which is coupled to the coupling circuit 170. In this embodiment, the processing modules 190, 200, and 210 may be used as parallel processors, independent processors, and/or as co-processors. In addition, or in the alternative, the memory 192, 202, and 212 may be used as a single memory device, as shared memory devices, and/or as independent memories.

Figure 10:
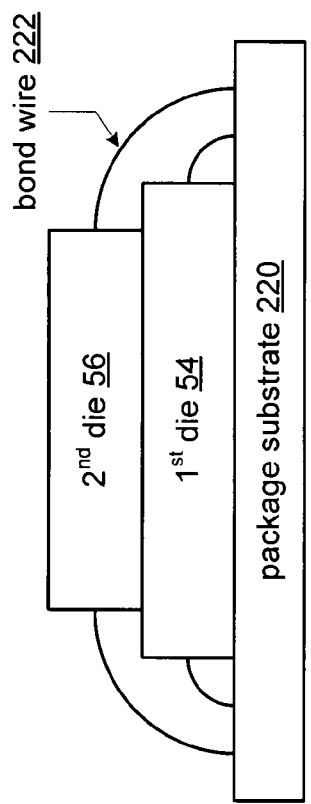
FIG. 10 is a diagram of an embodiment of an integrated circuit (IC) in accordance with the present invention.

FIG. 10 is a diagram of an embodiment of an integrated circuit (IC) 52 that includes the first die 54, the second die 56, a package substrate 220, and the coupling circuit 120. In this embodiment, the first and second dies 54 and 56 are stacked one on top of the other (note that the dies could be stacked the other way) and mounted on the package substrate 220. The coupling circuit 120 includes a plurality of bond wires 222 that couple each of the dies 54 and 56 to the package substrate.

Figure 11:
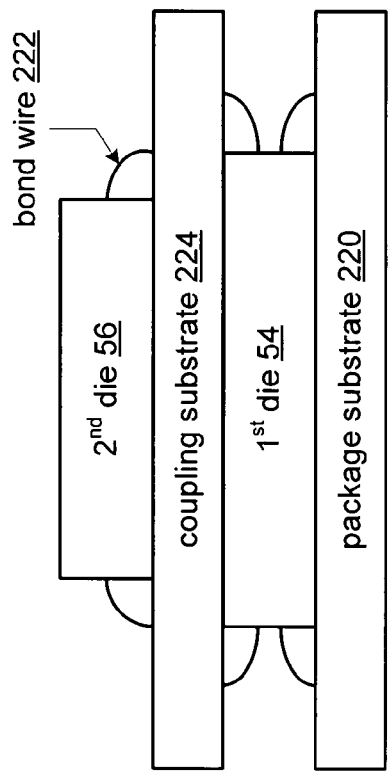
FIG. 11 is a diagram of another embodiment of an integrated circuit (IC) in accordance with the present invention.

FIG. 11 is a diagram of another embodiment of an integrated circuit (IC) 52 that includes the first die 54, the second die 56, a package substrate 220, a coupling substrate 224, and the coupling circuit 120. In this embodiment, the first die 54, the second dies 56, and the coupling substrate 224, which may be a printed circuit board, are stacked one on top of the other (note that the dies could be stacked the other way) and mounted on the package substrate 220. The coupling circuit 120 includes a plurality of bond wires 222 and the coupling substrate 224 that couples the dies 54 and 56 to each other.

Figure 12:
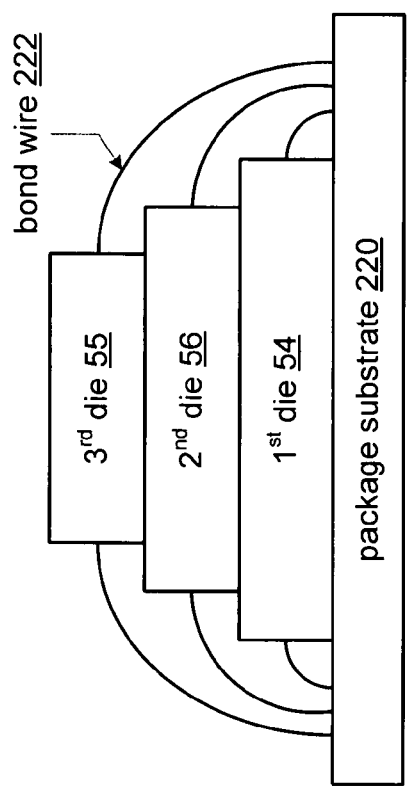
FIG. 12 is a diagram of another embodiment of an integrated circuit (IC) in accordance with the present invention.

FIG. 12 is a diagram of another embodiment of an integrated circuit (IC) 52 that includes the first die 54, the second die 56, the third die 55, a package substrate 220, the coupling circuit 120, and the coupling circuit 170. In this embodiment, the first-third dies 54-56 are stacked one on top of the other (note that the dies could be stacked in any order) and mounted on the package substrate 220. The coupling circuits 120 and 170 include a plurality of bond wires 222 that couples each of the dies 54-56 to the package substrate 220.

Figure 13:
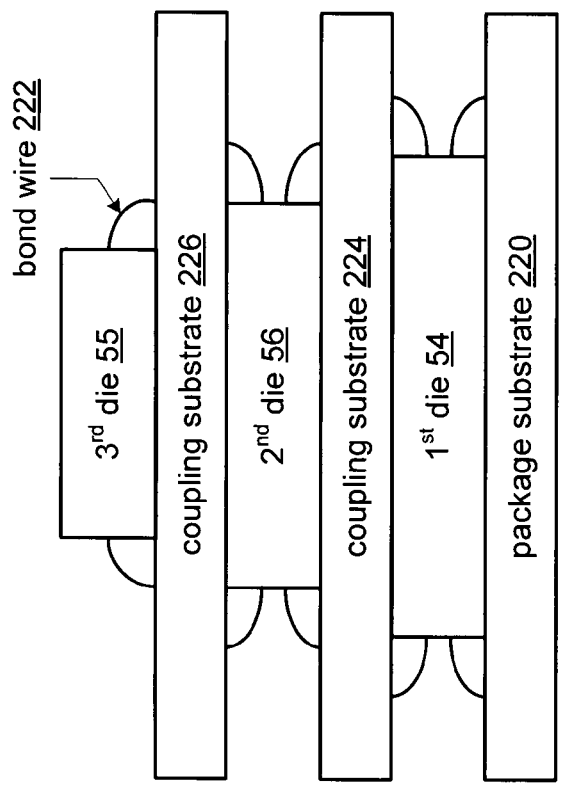
FIG. 13 is a diagram of another embodiment of an integrated circuit (IC) in accordance with the present invention.

FIG. 13 is a diagram of another embodiment of an integrated circuit (IC) 52 that includes the first die 54, the second die 56, the third die 55, a package substrate 220, the coupling circuit 120, and the coupling circuit 170. In this embodiment, the first-third dies 54-56 are stacked one on top of the other (note that the dies could be stacked in any order) and mounted on the package substrate 220. The coupling circuits 120 and 170 includes the coupling substrates 224 and 226 and the plurality of bond wires 222 that couples the dies 54-56 to each other.

Figure 14:
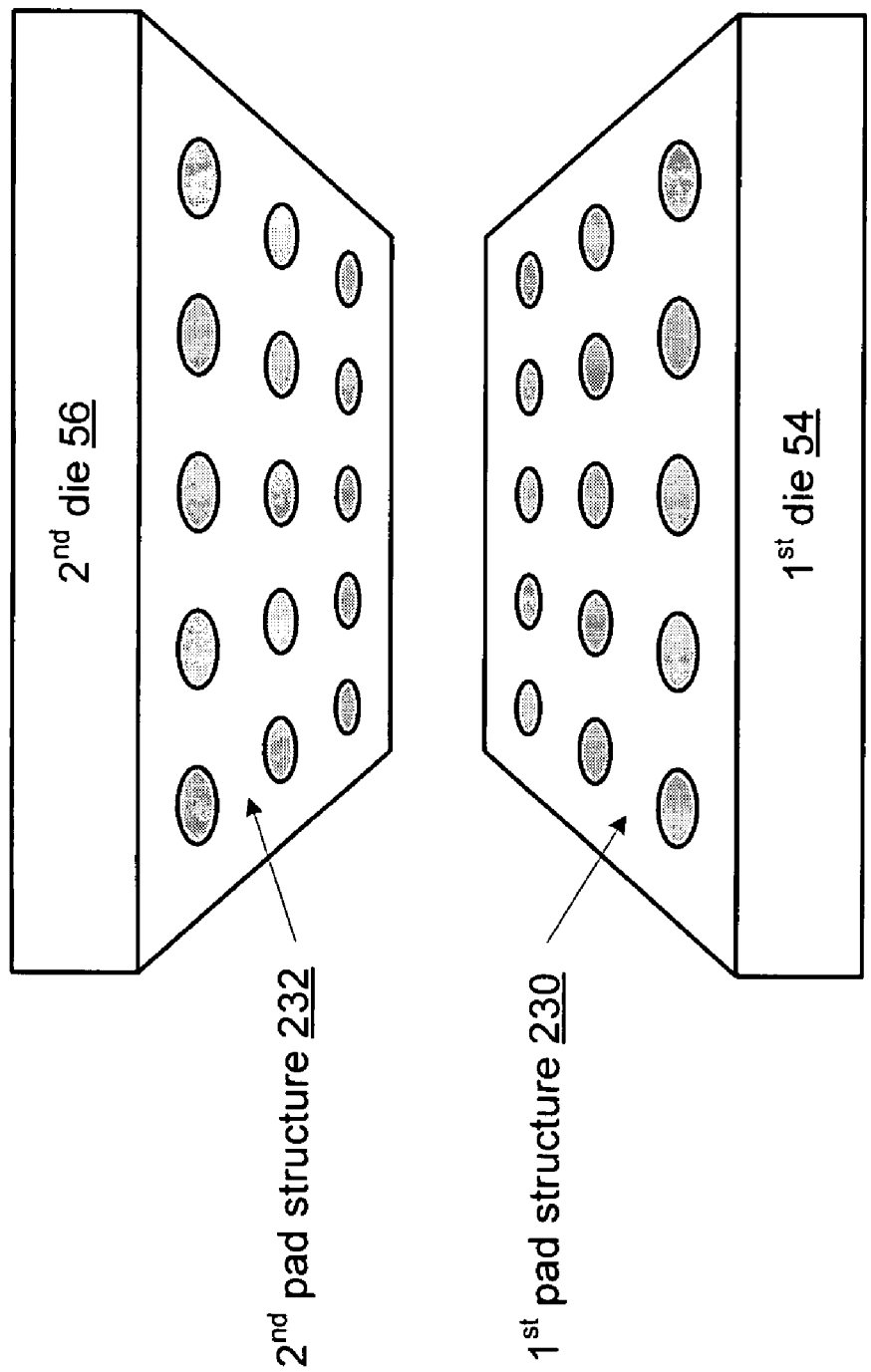
FIG. 14 is a diagram of another embodiment of an integrated circuit (IC) in accordance with the present invention.

FIG. 14 is a diagram of another embodiment of an integrated circuit (IC) 52 that includes the first die 54, the second die 56, a package substrate 220, and the coupling circuit 120. In this embodiment, the first and second dies 54 and 56 are stacked one on top of the other (note that the dies could be stacked the other way) and mounted on the package substrate 220. The coupling circuit 120 includes a first pad structure 230 on the first die 54 and a second pad structure 232 on the second die 56, where the pad structures 230 and 232 couple the dies 54 and 56 to each other.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. An integrated circuit (IC) comprises:
   a first die including:
      a processing module coupled to generate outbound data from an outbound signal in accordance with at least one upper layer of a wireless communication protocol and to convert inbound data into an inbound signal in accordance with the at least one upper layer of the wireless communication protocol;
      a baseband processing module coupled to convert the outbound data into an outbound symbol stream in accordance with at least one lower layer of the wireless communication protocol and to convert an inbound symbol stream into the inbound data in accordance with the at least one lower layer of the wireless communication protocol; and
      a radio frequency (RF) section coupled to convert the outbound symbol stream into an outbound RF signal and to convert an inbound RF signal into the inbound symbol stream;
   a second die including memory to store operational instructions corresponding to the wireless communication protocol;
   a packaging substrate supporting the first and second dies, wherein the first and second dies are stacked with respect to the packaging substrate; and
   coupling circuit to couple the first die to the second die.

2. The IC of claim 1, wherein the memory further stores at least one of the inbound signal and the outbound signal.

3. The IC of claim 1 further comprises:
   the processing module providing signaling to the memory via the coupling circuit, wherein the signaling includes at least one of operational instruction retrieval, data storage, and data retrieval.

4. The IC of claim 1, wherein the coupling circuit comprises a plurality of bond wires.

5. The IC of claim 1, wherein the coupling circuit comprises:
   at least one coupling substrate that includes traces to electrically couple the first die to at least one of the second die and the package substrate.

6. The IC of claim 1, wherein the coupling circuit comprises:
   a first pad structure on the first die; and
   a second pad structure on the second die, wherein, when the first and second dies are stacked, the first pad structure and the second pad structure are aligned.

7. The IC of claim 1, wherein the first die further comprises:
   a second processing module for executing an operating system and user applications, wherein the second processing module interfaces with the memory via the coupling circuit.

8. The IC of claim 1, wherein the first die further comprises:
   a plurality of peripheral interfaces, wherein at least one peripheral circuit coupled to a corresponding one of the plurality of peripheral interfaces communications with the memory via the coupling circuit.

9. The IC of claim 1 further comprises:
   a third die including at least one of a second processing module and second memory.

10. An integrated circuit (IC) comprises:
    a first die including first circuitry;
    a second die including second circuitry;
    a packaging substrate supporting the first and second dies, wherein the first and second dies are stacked with respect to the packaging substrate; and
    coupling circuit to couple the first die to the second die, wherein the first and second circuitry communicate via the coupling circuit.

11. The IC of claim 10, wherein the coupling circuit comprises a plurality of bond wires.

12. The IC of claim 10, wherein the coupling circuit comprises:
    at least one coupling substrate that includes traces to electrically couple the first die to at least one of the second die and the package substrate.

13. The IC of claim 10 further comprises:
    a third die, wherein the first, second, and third dies are stacked with respect to the packaging substrate and communicate via the coupling circuit.

14. The IC of claim 10, wherein the coupling circuit comprises:
    a first pad structure on the first die; and a second pad structure on the second die, wherein, when the first and second dies are stacked, the first pad structure and the second pad structure are aligned.

15. An integrated circuit (IC) comprises:
    a first die including:
       a first bus;
       a first processing module coupled to the first bus;
       first memory coupled to the first bus; and
       a first interface coupled to the first bus;

a second die including:
   a second bus;
   a second processing module coupled to the second bus;
   second memory coupled to the second bus; and
   a second interface coupled to the second bus;
a packaging substrate supporting the first and second dies, wherein the first and second dies are stacked with respect to the packaging substrate; and
coupling circuit to couple the first interface to the second interface.

16. The IC of claim 15, wherein the coupling circuit comprises a plurality of bond wires.

17. The IC of claim 15, wherein the coupling circuit comprises:
   at least one coupling substrate that includes traces to electrically couple the first die to at least one of the second die and the package substrate.

18. The IC of claim 15, wherein the coupling circuit comprises:
   a first pad structure on the first die; and
   a second pad structure on the second die, wherein, when the first and second dies are stacked, the first pad structure and the second pad structure are aligned.

19. The IC of claim 15 further comprises:
a third die including:
   a third bus;
   a third processing module coupled to the second bus;
   third memory coupled to the second bus; and
   a third interface coupled to the second bus, wherein the first, second and third dies are stacked with respect to the packaging substrate, and wherein the coupling circuit couples the third interface to at least one of the first and second interfaces.

* * * * *